United States Patent [19]

Rhodes

[11] 4,300,095
[45] Nov. 10, 1981

[54] SELF EXCITED SATURATABLE CORE MAGNETIC FIELD DETECTION APPARATUS

[75] Inventor: Melvin H. Rhodes, Cedar Rapids, Iowa

[73] Assignee: Rockwell International Corporation, El Segundo, Calif.

[21] Appl. No.: 68,839

[22] Filed: Aug. 22, 1979

[51] Int. Cl.³ ............................................. G01R 33/04
[52] U.S. Cl. .................................................... 324/255
[58] Field of Search ................................ 324/251–253, 324/244, 260; 361/143, 152; 33/361

[56] References Cited

U.S. PATENT DOCUMENTS 3,460,029  8/1969  Guillemin ............................. 324/255

FOREIGN PATENT DOCUMENTS 1207313  9/1970  United Kingdom ................ 324/255

OTHER PUBLICATIONS

Ling, "Fluxgate Magnetometer for Space Application" Mar. 1964, J. Spacecraft, vol. 1, No. 2, pp. 175–180.

Primary Examiner—Gerard R. Strecker
Assistant Examiner—Walter E. Snow
Attorney, Agent, or Firm—Bruce C. Lutz; Richard A. Bachand; H. Fredrick Hamann

[57] ABSTRACT

A magnetic field sensing device comprising a magnetic rod which is direction sensitive relative to the field being measured. The rod is of such design that the magnitude or the strength of the field being sensed, significantly affects the magnitude of the excitation field required to produce a saturation of the magnetic core. An external field in the longitude direction of the core will require that the excitation field magnitude required to produce a given level of saturation will be different in one direction than in the other, by magnitude equal to twice the component of the external field acting upon the core. The excitation field is produced by current in the winding with the current changing at a given rate so that the induced or output voltage is greater than a specified value; as long as the core permeability is greater than a given specified value. Whenever the induced voltage drops below a given value, this situation is detected and the excitation field is reversed to give a constant rate of change of excitation in the opposite direction. A constant rate varying field is produced by an analog integrator used as a triangular voltage wave generator that is followed by a voltage-to-current converter with the current run through an excitational winding on a core. An external magnetic field acting on the core will cause the triangular voltage wave to be offset so that it is unsymmetrical, about zero. This average offset is detected and the value integrated in a second integrator. The outputs of the analog and second integrators are summed and the sum value is used to drive the voltage-to-current converter. The voltage value on the second integrator will be proportional to the component of the external magnetic field that is in the direction of the sensor.

6 Claims, 13 Drawing Figures

SELF EXCITED SATURATABLE CORE MAGNETIC FIELD DETECTION APPARATUS

THE INVENTION

The present invention is generally concerned with magnetics and more specifically concerned with a magnetic field strength detector which is field direction sensitive.

Although it is realized that there are various forms of field strength detection, it is believed that the simplicity of the present invention combined with the accuracy obtainable therefrom provides a superior field strength indication as compared to the prior art.

In accordance with the teachings of the present invention, it has been determined that if a magnetic rod is used with a very large length-to-diameter ratio, or in other words, very long compared to its diameter, its permeability at the center of the core will be very nearly equal to the permeability of the core material. More information relative to this subject may be found in a book entitled, "Ferromagnetism" by Bozorth published in 1951 by D. Van Nostrand Company, Inc. The pertinent material appears in pages 845 through 848 thereof. From this book and other sources, it may be determined that the field acting on the center of the core is given by the equation:

$$H = H_0 - \frac{N(B-H)}{4\pi}$$

where H is the field acting at the center of the rod, $H_0$ is the field in the solenoid, $N/4\pi$ is the demagnetizing factor as determined from a FIG. 19-4 in the referenced book, where N is much larger than 150 and M is the length-to-diameter ratio of the magnetic rod. It may be determined that for a ratio of 200 to 1 the value of $N/4\pi$ is 0.0001.

The present invention utilizes the change of permeability as the core approaches and goes into saturation. Although true saturation occurs when a large increase in field intensity H produces no further increases in magnetic flux density B, for the purposes of this invention and as normally used in the trade, saturation is defined as the situation where the permeability falls to a very low value as compared to the maximum value obtained for that particular solenoid. When using the particular core material (high-mu 80) used in the present invention, the permeability of the core material changed from approximately 100,000 to 1,000 as the field across the material was increased. This permeability can be calculated according to the following equation:

$$1/\mu = 1/\mu' + N/4\pi$$

where $\mu'$ is the apparent permeability, $\mu$ is the permeability of the material and $N/4\pi$ is the demagnetizing factor found previously. Using the above equation, it may be determined that for $\mu = 100,000$, $\mu' = 9,090$. For $\mu = 10,000$, $\mu' = 5,000$ and for $\mu = 1,000$, $\mu' = 909$.

The present invention relies on a determination of when the permeability decreases below a specific value and the relative comparison of the excitation fields required to reduce the permeability to the given value. This comparison is obtained by checking the duration of a signal of greater than a predetermined amplitude at the output winding on the sensor coil at positive as compared to negative voltage levels since as the permeability of the material drops, as known, the output voltage drops even though there is a constant rate excitation signal being applied. Also although the volt-second product remains constant for both directions of saturation, there will be detectable variations in duration accompanied by appropriate changes in maximum levels.

As indicated, the excitation field provides a constant rate of current through a coil that has a small diameter-to-length ratio. The current flow is changed in direction through logic circuitry when the permeability drops below a given value.

The field required to decrease the permeability of the core material to 5,000 requires about 0.1 oersted and the earth's maximum field is 0.6 oersteds. Since the two fields (core field and earth's field) can sum in the core, the core should be designed to accommodate 0.7 oersteds maximum (for sensing the earth's field) plus the $N/4\pi$ demagnetizing factor as determined from the above reference for $m = 200$ and $N/4\pi = 0.0004$.

Using the information provided above and assuming that B is 6,000 gauss, it may be determined that $H_0$ will equal 3.1 oersteds peak.

The field at the center of a coil with a long length-to-diameter ratio is:

$$H_0 = 1.26NI$$

(from The Engineers Manual by Ralph G. Hadsom, SB, John Wiley & Sons, Inc., Copyright 1917, 1939, Second Edition, Eleventh Printing, October 1947, page 191) where N is the turns per centimeter for the coil and I is the current through the coil. If number 40 wire is used and the turns per centimeter is about 100, a resultant peak current is required of about 0.0246 amperes.

If it is desired that the frequency be around 400 hertz for excitation, the rate of change for the current would be in the neighborhood of 39.4 amperes per second.

As will be realized by those skilled in the art, the effective area of a solenoid coil is increased by a high permeability core. The effective permeability of approximately 9,000 will increase the area occupied by the core in accordance with known equations.

The present inventive concept accomplishes magnetic field strength detection by using a symmetrical wave, which in one embodiment is a triangular wave, to drive a magnetic core material, comprising a small magnetic material wire about two inches in length, wherein the driving current is biased so as to substantially exactly counteract the effects of the magnetic field component aligned with the axis of the rod. This driving current is a feedback signal which is generated in response to a second winding output from the rod. If the effects of the field are exactly counteracted by the bias in the driving signal, the saturation times of the rod will be identical and a polarity logic circuit connected to the second winding will provide a symmetrical square wave output. If, however, the bias on the drive signal does not exactly counteract the effects of the field, the polarity logic circuit will provide a nonsymmetrical output signal which when integrated will provide a biased triangular wave signal. If the positive and negative voltage peaks of the biased triangular wave output signal are detected, summed and integrated, an output will be obtained indicative of the integrated value of bias obtained up to that point in time. This integrated bias signal is indicative of the flux component in the direction of the axis of the magnetic rod. By summing this signal with the first integrated triangular wave and converting the voltage signal to a current signal the drive signal is generated as a feedback signal.

It is therefore an object of the present invention to provide an improved magnetic field strength detection device.

Other objects and advantages of the present invention may be ascertained from a reading of the specification and appended claims in conjunction with the drawings wherein:

DETAILED DESCRIPTION

Figure 1:
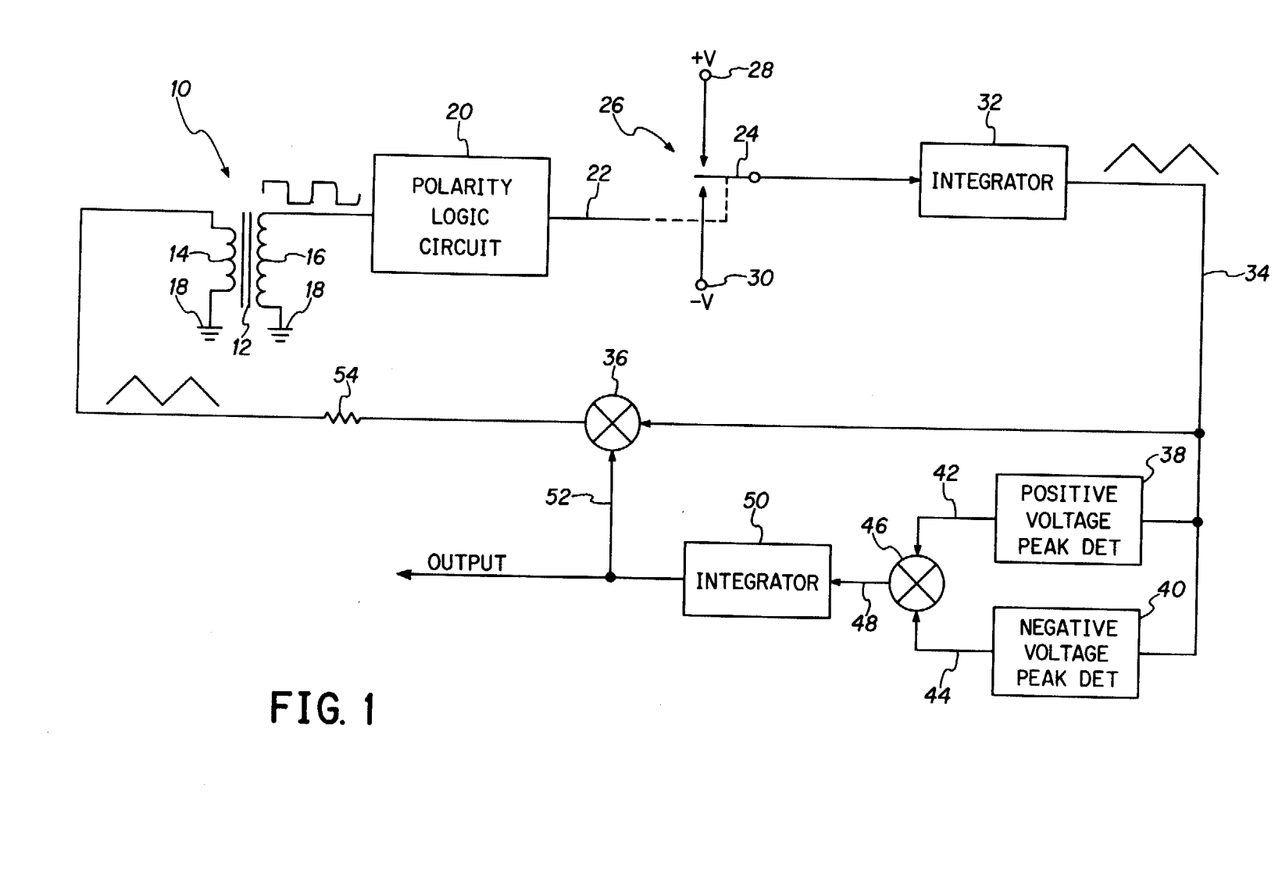
FIG. 1 is a block diagram of one embodiment of the inventive concept.

In FIG. 1 the magnetic sensing apparatus indicated generally as 10 comprises a magnetic rod 12 and first and second windings 14 and 16 respectively. The windings are each connected at one end to ground 18 while winding 16 is connected at the other end to a polarity logic circuit 20. As illustrated, the winding 16 is a secondary winding and provides a voltage output similar to that shown, to the polarity logic circuit 20. Polarity logic circuit 20 senses when the input voltage to it drops below a specified value and provides an output on lead 22 used to control the position of a movable contact 24 of a switch generally indicated as 26. Contact 24 moves so that it is always in contact with either a positive voltage source 28 or a negative voltage source 30. Movable contact 24 supplies an electric signal from either positive or negative voltage sources 28 and 30 respectively to an integrator 32 that provides an output voltage that varies at a constant volt per second rate, as determined by the constants of the integrator 32 and the square wave input. This output voltage 34 is summed with a voltage signal on lead 52 in summing device 36. The resultant sum is converted to a current by resistor 54. The current in winding 14 varies at a rate proportional to the voltage rate of change of the signal on lead 34. This constant rate of change of current produces a rate of change of flux in the core that is proportional to the rate of change of current and the instantaneous or incremental permeability of the core. The instantaneous permeability is a function of the core material and the magnetic flux magnitude in the core. The flux magnitude is a non-linear function of the magnetic field acting on the core. The integrator 32 continues to produce a rate of change of voltage in one direction so as to give a constant rate of change of current in winding 14 until the voltage magnitude from winding 16 drops below a magnitude determined by the polarity logic circuit 26. At that instant the polarity logic circuit reverses the voltage to the integrator by controlling the switch 26.

The total magnetic field acting upon the magnetic core 12, is a sum of the total current in winding 14 times a constant (K) and any external magnetic field acting upon the core. For a constant rate of change of field on the core, the voltage output of winding 16 will drop below a specified value at a fixed magnitude of total field acting on the core for either positive or negative going rates. The difference between the current to produce the field in one direction and the current to produce the field in the other direction, is proportional to the magnitude and direction of the external field acting on the core.

For an example, if no external field is acting on the core and the integrator 50 output is zero, then the voltage waveform of integrator 32 will be as shown on output lead 34 and in FIG. 3a, and the waveform from winding 16 will be somewhat like FIG. 3b. If, on the other hand, an external field is acting on the core, or if the output of integrator 50 is not zero, and the external field is zero, the voltage waveform 34 will be similar to those waveforms shown in FIG. 3c or FIG. 3d.

The unsymmetry of the waveform, with respect to a zero or reference level, is sensed and integrated to produce a voltage on lead 52 that will make the waveform on lead 34 symmetrical about zero.

Two peak voltage detectors 38 and 40 receive signals on lead 34 and provide outputs 42 and 44 which are summed in block 46 to provide a signal on lead 48 to an integrator 50. An output 52 of integrator 50 is used to provide an input to a summing means 36 which also receives signals on the lead 34 from integrator 32. Summing means 36 provides an output signal through a voltage-to-current signal converting resistor 54 to provide a biased triangular wave input to winding 14 of magnetic sensor 10. The triangular wave applied to magnetic sensor 10 is a combination of the triangular wave on lead 34 plus a bias introduced by integrator 50 which should substantially compensate for any magnetic field component aligned with the axis of magnetic rod 12 so as to produce a situation of no residual flux within magnetic rod 12 thus providing a symmetrical wave output. This symmetrical wave output will normally be but is not necessarily a square wave. However, the positive and negative half cycles will be mirror images of each other. The voltage magnitude of each half cycle of this waveform will be proportional to the effective permeability of the core and since the permeability varies with the flux level in the core, the voltage will not normally be a flat-top square wave. However, for convenience and due to terminology often used in the art, this waveform will be called "square wave". As used herein, square wave is intended to include waveforms which have nonsymmetrical positive and negative time durations and would more accurately be called rectangular waves except for the fact that square wave has been used to define any rectangular waveform by those skilled in the art over a great span of time.

Figure 2:
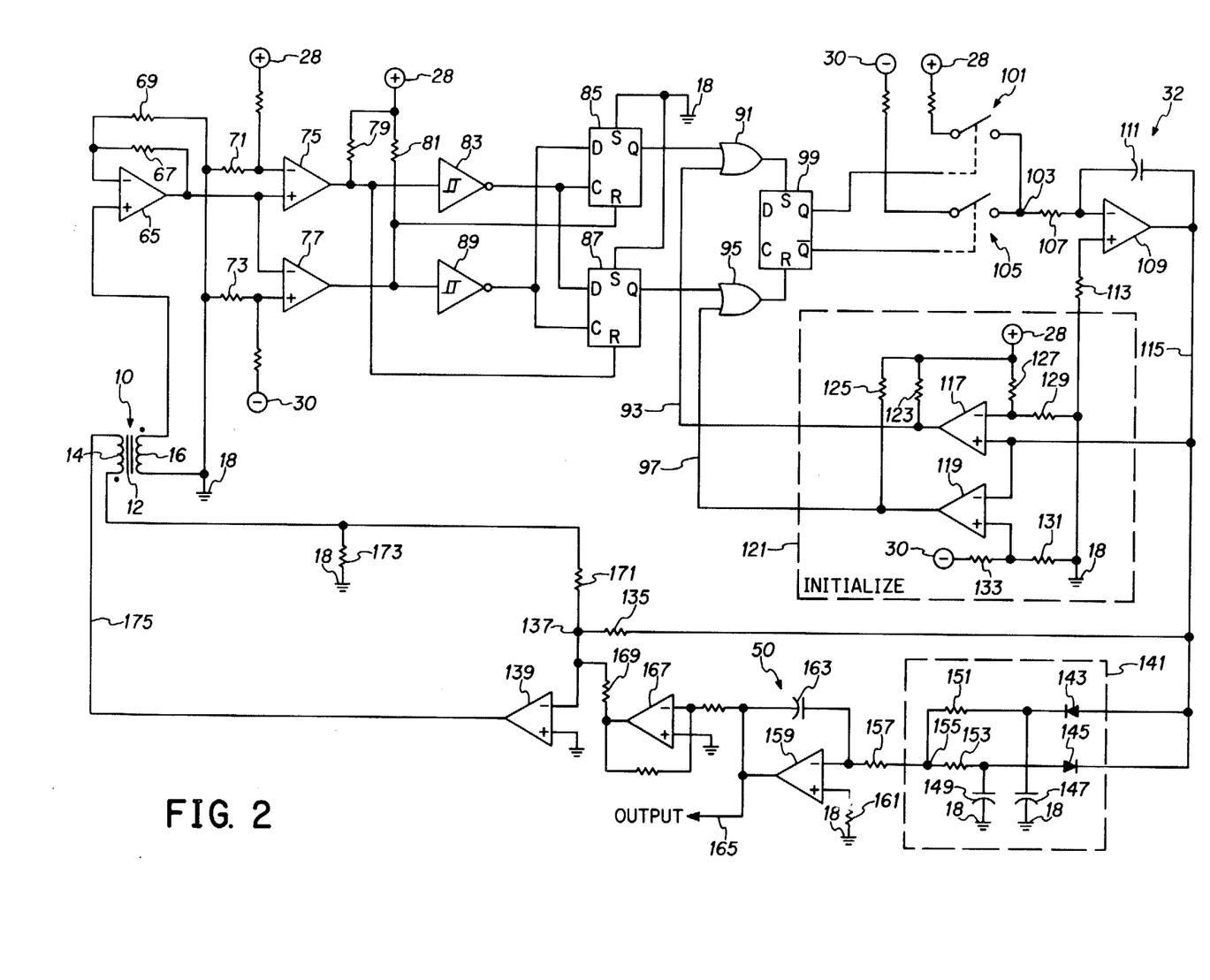
FIG. 2 is a more detailed block diagram of FIG. 1.

In FIG. 2 the same numbers as used in FIG. 1 are used where applicable. As illustrated, the nongrounded lead of winding 16 is connected to a positive or noninverting input of a differential amplifier 65 which has a feedback resistor 67. Resistor 67 is connected between the output of amplifier 65 and the inverting input of amplifier 65. A resistor 69 is connected between the inverting input and ground 18. Ground 18 is connected through resistors 71 and 73 to inverting and noninverting inputs of further operational or differential amplifiers 75 and 77 respectively. An output of amplifier 65 is connected to the noninverting input of amplifier 75 and to the inverting input of amplifier 77. Positive power supply 28 is connected through pull-up resistors 79 and 81 to the outputs of amplifiers 75 and 77 respectively. As known to those skilled in the art, resistors 79 and 81 are not required for all types of operational amplifiers used as comparators. Amplifier 75 has its output connected through an inverting amplifier 83 (of the Schmitt trigger type which may be purchased as part number DM54 from National Semiconductor) to a clock (C)

input of D flip-flop 85. The output of amplifier 75 is also connected to a reset (R) input of a D flip-flop 87. An output of amplifier 77 is connected to an inverting amplifier 89 (also of the Schmitt trigger type) and also to a reset (R) input of D flip-flop 85. An output of inverter 89 is connected to the D input of D flip-flop and also to the clock input of D flip-flop 87. Ground 18 is connected to the set (S) inputs of both D flip-flops 85 and 87. The Q output of flip-flop 85 is connected to one input of an OR gate 91 which gate receives its second input on a lead 93. The Q output of flip-flop 87 is connected to one input of an OR gate 95 which gate receives its other input on a lead 97. The outputs of OR gates 91 and 95 are connected to set and reset inputs of a D flip-flop 99. A Q output of D flip-flop 99 is connected to operate a switch generally indicated as 101 connected between positive power supply 28 and a junction point 103. The $\overline{Q}$ output of flip-flop 99 is connected to operate a switch generally indicated as 105 connected between negative power terminal 30 and junction point 103. Junction point 103 is connected through a resistor 107 to an inverting input of an amplifier 109 forming a part of integrator 32. A capacitor 111 is connected between an output of amplifier 109 and the inverting input. The noninverting input of amplifier 109 is connected through a resistor 113 to ground 18. The output of amplifier 109 is connected via a lead 115 to positive (noninverting) and negative (inverting) inputs of operational amplifiers 117 and 119 respectively in an initialization circuit generally indicated as 121 wherein the outputs of amplifiers 117 and 119 are connected to leads 93 and 97 respectively. Positive power terminal 28 is connected via pull-up resistors 123 and 125 to the outputs of amplifiers 117 and 119 respectively. Positive power supply 28 is also connected through a resistor divider network comprising 127 and 129 to the inverting input of amplifier 117 and ground 18. The noninverting input of amplifier 119 is connected through a resistor 131 to ground 18 and through a resistor 133 to negative power supply 30. Lead 115 is also connected through a resistor 135 to a junction point 137 which is also connected to an inverting input of an operational amplifier 139, which in combination with other components, is used as a summing means and voltage-to-current converter and thus supplies the functions of 36 to 54 in FIG. 1. Lead 115 is also connected to a peak-to-peak rectifier generally indicated as 141 which provides the functions of blocks 38 and 40 in FIG. 1. Internal to block 141 are diodes 143 and 145 wherein diode 143 is connected through a capacitor 147 to ground 18 and diode 145 is connected to ground 18 through a capacitor 149. A pair of resistors 151 and 153 connect the diodes 143 and 145 to a junction point 155 which forms the output of peak-to-peak rectifier 141. Junction point 155 is connected through a resistor 157 to an inverting input of an operational amplifier 159 forming a portion of integrator 50. The noninverting input of amplifier 159 is connected through a resistor 161 to ground 18. A capacitor 163 is connected in a feedback fashion around amplifier 159 to provide the integrating action. An output of amplifier 159 provides an output signal on a lead 165 which is indicative of the magnetic field strength of the field being sensed. Output 165 is also connected through an inverting amplifier 167 (having a gain of −1) and a summing resistor 169 to junction point 137. Junction point 137 is connected through a resistor 171 to one lead of winding 14 and through a resistor 173 to ground 18. An output of summing amplifier or voltage-to-current converter 139 is connected via a lead 175 to the other lead of winding 14.

FIGS. 3a, 3c and 3d are indicative of the signal conditions on lead 34. FIG. 3b is indicative of the signal appearing at the output of winding 16 and this waveform should remain essentially constant regardless of the sensed conditions.

Figure 4:
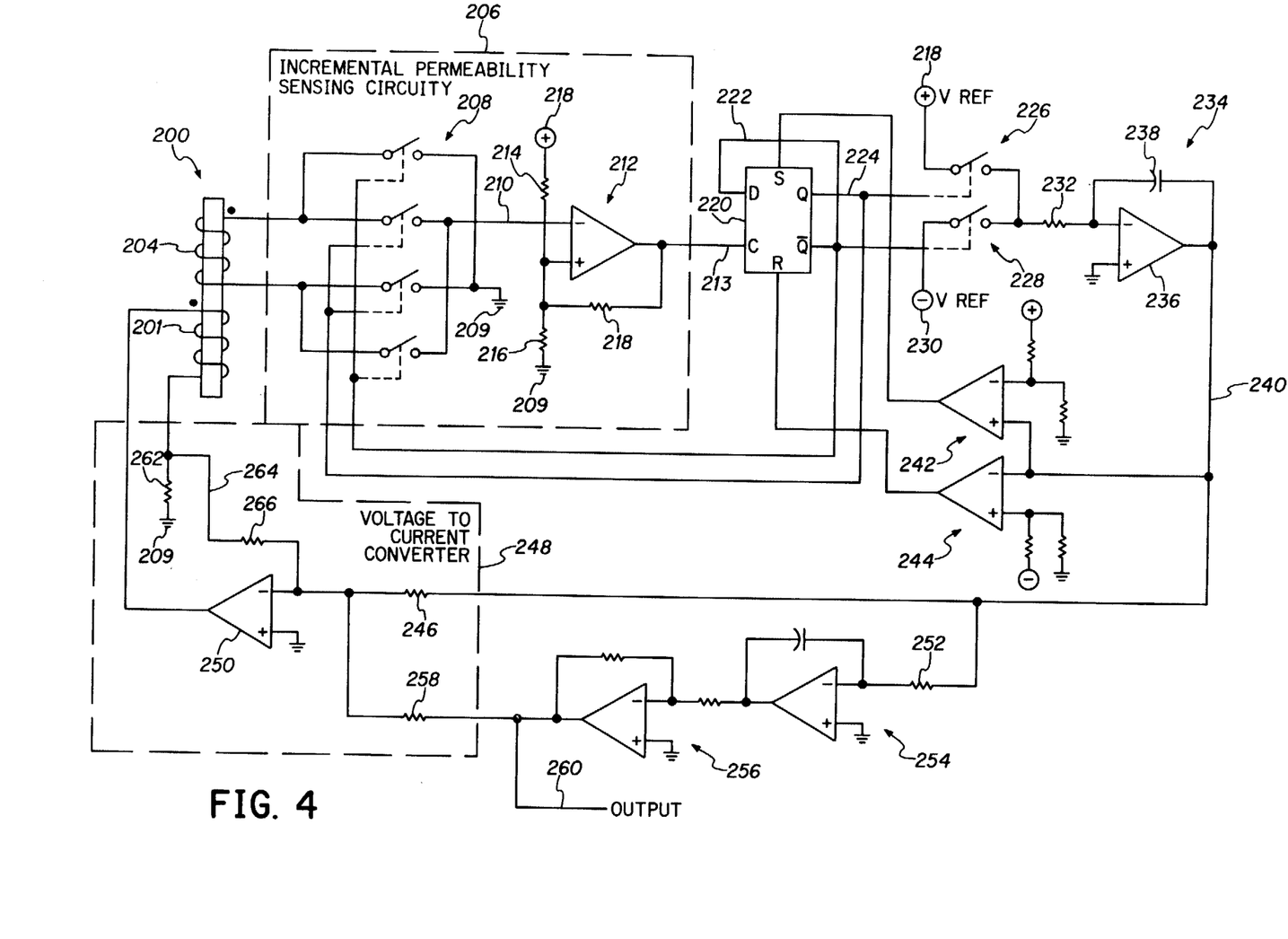
FIG. 4 is a schematic diagram of a further embodiment of the inventive concept.

In FIG. 4 a magnetic sensor generally designated as 200 has a first winding 201 and a second winding 204. Winding 204 supplies signals to a dash line block 206 which comprises an incremental permeability sensing circuit. Within this block a set of switches generally designated as 208 receives signals from winding 204 and passes signals between ground 209 and a lead 210 to a voltage comparator 212. These signals are supplied to the inverting input of comparator 212 while its noninverting input is connected to a junction between bias resistors 214 and 216. These resistors are connected between a positive power supply 218 and ground 209. Comparator 212 has a feedback resistor 218 and supplies output signals to a clock input of a D flip-flop generally designated as 220 which has its $\overline{Q}$ output supplied back to a D input thereof on a lead 222. The Q and $\overline{Q}$ outputs of block 220 supply return signals on leads 224 and 222 respectively to control the switches 208. Leads 224 and 222 also control switches 226 and 228. These two switches are connected to opposite polarity power supplies 218 and 230 for supplying the square-wave input through a resistor 232 to a triangular voltage generator (integrator) generally designated as 234 comprising an operational amplifier 236 and a feedback or integrating capacitor 238. An output lead 240 of integrating amplifier 234 is connected to supply signals to two comparator circuits 242 and 244 which provide initialization functions to the detection circuit and are used to operate the set (S) and reset (R) inputs of D flip-flop 220. Lead 240 supplies signals through a resistor 246 within a voltage-to-current conversion block 248 to the inverting input of a summing amplifier 250. Lead 240 also supplies signals through a resistor 252 to an integrator generally designted as 254. The output of integrator 254 is then supplied through an inverting amplifier 256 and a summing resistor 258 as a second input to summing amplifier 250. The output of amplifier 256 is designated as 260 and provides an output signal from the circuit indicative of the external field being sensed by sensor 200. An output of amplifier 250 is connected to one end of winding 201 while the other end of winding 201 is connected through a resistor 262 to ground 209. That same end of winding 201 is also connected via a lead 264 through a resistor 266 to the inverting input of amplifier 250.

Figure 5:
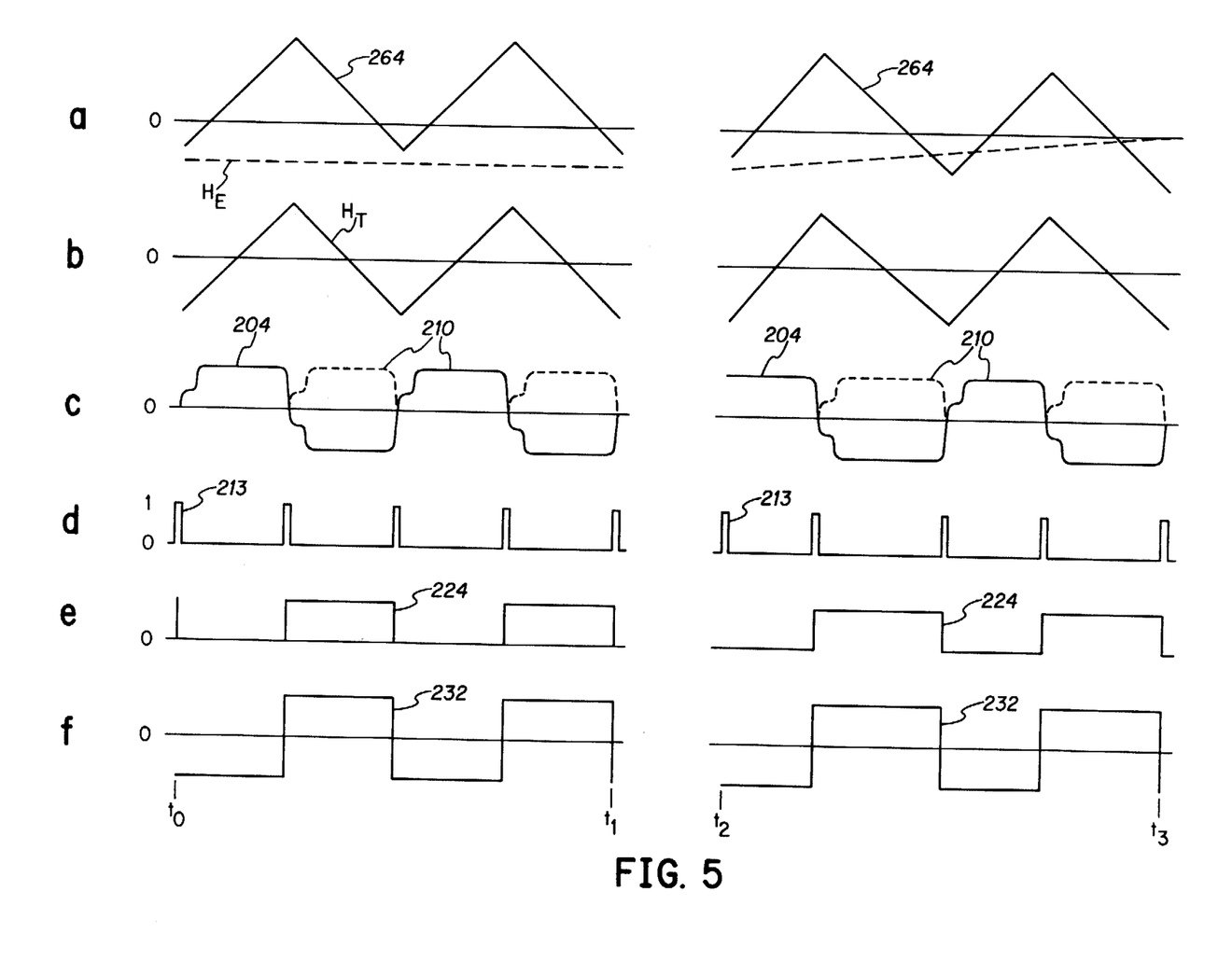
FIGS. 5a–5f comprise a set of waveforms used in explaining the operation of FIG. 4.

FIGS. 5a–5d are illustrative of the signals found at various points in FIG. 4. Waveform a in FIG. 5 is illustrative of the signals found on lead 264 while the dash line in FIG. 5a is indicative of $H_E$ or the magnetic flux induced into the core by the external magnetic field being sensed. In FIG. 5b, $H_T$ is the total flux in the core produced both by the external field $H_E$ and the biased feedback waveform 264. FIG. 5c illustrates the signals appearing at the output of winding 204 in solid lines and the upper portions of which are found at the output of switch 208 on lead 210. Switch 208 effectively acts as a full-wave rectifier and inverts the negative portions of the output from winding 204. Waveform d is indicative of the output 213 of comparator amplifier 212. The waveforms illustrated in FIG. 5e are indicative of the signals appearing at the Q output 224 of D flip-flop 220.

Finally, the waveforms in line f are indicative of those appearing at the output of the set of switches 226 and 228 and thus of the current flowing through resistor 232.

OPERATION

Figure 3:
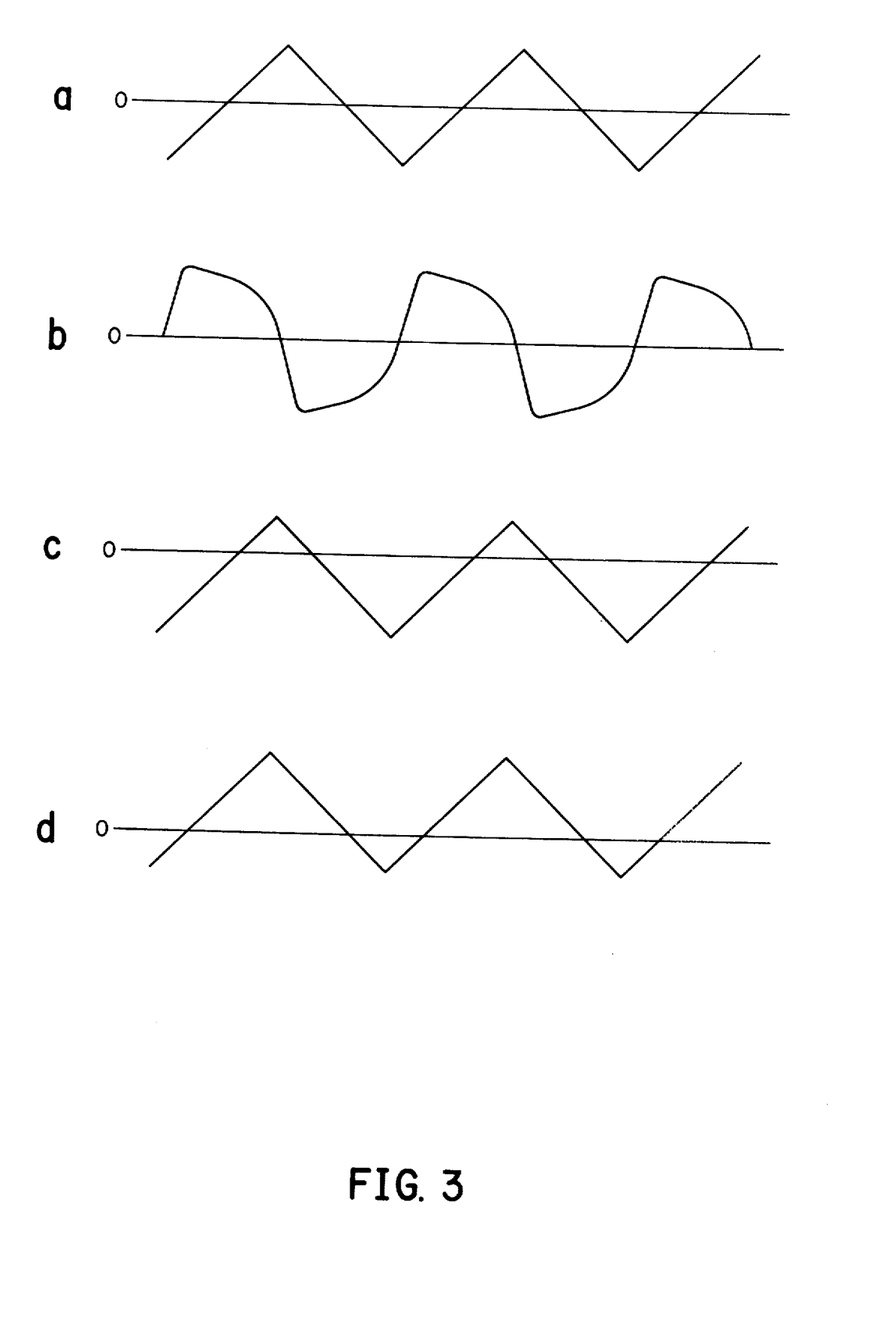
FIGS. 3a–3d comprise a set of waveforms for use in explaining the operation of FIGS. 1 and 2.

As already indicated, the magnetic core used for providing the magnetic field sensing in one embodiment was a wire or rod of magnetic material. This embodiment used a magnetic rod which was approximately two inches long and 0.010 inches in diameter. This rod is driven to saturation in both directions by a driving signal such as appears on winding 14 of FIG. 1. The rod will become very quickly saturated and thus produce a rectangular or square-wave output. The time duration of each one-half cycle of the waveform appearing at the output of winding 16 will have equal volt-second product positive and negative portions. If temperature may be disregarded as a distorting factor, the time duration of these portions will be a function of the time it takes for the core to go from a saturation, as defined herein, in one direction to the same saturation in the other direction. This volt-second product should and will remain equal regardless of the magnitude of any external field acting upon the core. The drive current or excitation current to winding 14 will follow magnitude waveforms similar to that of FIGS. 3a, 3c or 3d and the non-symmetry of the waveforms with respect to a given reference potential will be a function of the magnitude of external fields acting upon the core. While not shown in detail, the waveform of FIG. 3 will also alter as a function of the external fields acting upon the core. However, the feedback will prevent this from being noticeable. The volt second product of each half cycle will be identical for the output of winding 16 and will increase in amplitude and decrease in time duration so as to provide an input signal to integrator 32. However, as mentioned, the feedback will immediately correct this situation and the output of winding 16 will normally remain as shown in FIG. 3b.

If a magnetic material is to be adequately sensitive to small changes in magnetic fields, it must be of such a material and coacting with a coil such that it can become very quickly magnetized. In other words, the incremental permeability must change substantially for a small change in the field strength. The differential peak field strength required by the core to obtain saturation in each direction is proportional to an external field acting upon the magnetic core of the sensor. As illustrated, the present invention provides a feedback signal which substantially cancels the effect of the magnetic field being sensed by integrating the values of the field sensed to date and storing this information. Thus, the magnetic rod is maintained in a maximum sensitivity condition of substantially zero flux when the drive signal is at the center point of its positive and negative excursions.

As previously indicated, the winding 16 will provide an output wave which, in most instances, will be substantially square. The polarity and magnitude of this output voltage signal is sensed by the circuitry within the block 20. The function of block 20 is to sense when the voltage waveform drops below a predetermined level. When this happens it will actuate switch 26 to the opposite polarity. Referring to FIG. 2, a better understanding of block 20 can be provided. Amplifier 65, feedback resistor 67 and the resistor 69 provide a voltage amplification of the voltage on winding 16 and this voltage is applied to the noninverting (+) terminal of amplifier (voltage comparator) 75 and the inverting (−) terminal of amplifier (voltage comparator) 77. As previously stated, the resistor pattern network from the positive voltage 28 to ground 18 provides a positive bias signal to the inverting terminal of the voltage comparator 75. Whenever the voltage on the noninverting terminal is less than the positive bias on the noninverting terminal of 75, the output from 75 will be a logic zero. When the voltage on the inverting terminal of voltage comparator 77 is more positive than the negative bias signal provided by the resistor divider network between the negative supply and ground, as applied to the noninverting terminal of 77, the output of 77 will be zero. Logic inverter amplifier 83 provides a complement of the logic signal from voltage comparator 77. These logic converters are of the symmetric type in order to provide a fast rise time at the clock inputs to the "D" flip-flops 85 and 87. The function of the "D" flip-flop 85 is to provide a "setting" action within the flip-flop 99 and the function of "D" flip-flop 87 is to provide the "resetting" action within the flip-flop 99. As previously stated, the flip-flop 99 controls a switch closure of 101 or 105 (shown as 26 in FIG. 1).

Assume for the moment that the switch 105 has just closed, this will produce a signal with a positive going rate at the output of the integrator amplifier 109. This output from amplifier 109 will produce a negative voltage on lead 175 of amplifier 139 and a current through the winding 14 to produce a positive voltage on the noninverting terminal of amplifier 65 to provide positive output voltage therefrom. This, in turn, will produce a positive voltage on the noninverting terminal of 75 which is greater than the bias voltage on the inverter terminal so that the output of the voltage comparator 75 will be positive. This positive voltage will reset the flip-flop 87 making the "Q" output from 87 equal to zero. The "D" input to 85 will have a positive value since the voltage to the inverting terminal of 77 will be positive with respect to bias. The output from comparator 77 will be zero and the voltage on the output of inverter 89 will be a logic one, making a logic one on the "D" input to flip-flop 85. Whenever the core's permeability drops below a given value so that the voltage on the output of amplifier 65 drops below the bias level provided on the inverting terminal of comparator 75, the output of comparator 75 will go to logic zero and the output from the inverting amplifier 83 then will go from a logic zero to a logic one. This will set the "D" flip-flop 85 to have a logic one value which appears on the output "Q" of block 85. This will set the "Q" output on flip-flop 99 to a logic one and in turn will close switch 101 and open switch 105. This will reverse the rate of change of voltage on lead 115 to the opposite polarity making its voltage go negative at a given rate. This, in turn, will reverse the direction of the current through the winding 14 and the voltage output from winding 16 will be a negative value which, when amplified, will be more negative than the bias produced on the noninverting terminal of voltage comparator 77. This negative voltage on the input of comparator 77 will produce a logic one at the output so as to reset flip-flop 85. The voltage on the output of comparator 75 will be a logic zero which, after inversion by inverter 83, provides a logic one at the "D" input of flip-flop 87. When the negative input signal from winding 16 via amplifier 65 becomes less negative than the bias produced by the resistor divider network to the noninverting terminal of comparator 77, the output of the voltage comparator 77 will go to logic zero at which time the output from the inverter 89 will go from a logic zero to a logic one thereby clocking the logic one on the "D" input of flip-flop 87 to the "Q" output of flip-flop 87. This will reset the flip-flop 99 thereby causing switch 105 to close and 101 to open. In order to guard against a steady state condition where the flip-flop 99 is set and the integrator 109 is at max positive or negative values while the output from the winding 16 is zero, an intialization circuit 121 is used to reverse the polarity to the input of the integrator causing it to go in the opposite direction. For example, if the output from the integrator 109 is more positive than the bias as determined by the supply 28 and the resistor divider 127 and 129, the output from the voltage comparator 117 will set the flip-flop 99 through the OR gate 91 so as to close switch 101 which will begin a rate of change of voltage in the negative direction. Likewise, if the output from the integrator amplifier 109 is more negative than the bias produced on the noninverting terminal of comparator 119 as determined from the negative voltage in the resistor divider network 133 and 131, the output from voltage comparator 119 will be a positive value and through the OR gate 95 will reset the integrator 99 to close switch 105 and open switch 101 to produce a negative voltage to the input of the integrator thereby making the voltage go from negative to positive at a given rate.

A condition of balanced feedback operation is shown in FIGS. 3a and 3b. In other words, FIG. 3a illustrates the output signal of integrator 32 on line 34. FIG. 3b illustrates a substantially square wave output appearing on the upper lead of winding 16 and input to polarity logic circuit 20. It may now be assumed that the magnetic field being sensed suddenly increases so that the time duration of the negative pulses of FIG. 3b is increased with respect to the time duration of the positive pulses. This will maintain switch 26 such that the contact 24 provides negative signals from terminal 30 to integrator 32 for a longer time thus providing a larger quantity negative charge than is obtained from the positive voltage source 28. In this event, the triangular wave output on lead 34 is as shown in FIG. 3c. The positive and negative voltage detectors wil detect this situation and thus there will be a larger signal on lead 44 than there is on lead 42. The difference in these two amplitudes is applied on lead 48 to integrator 50 so as to provide a larger than previous positive signal on lead 52. Thus, the output signal from summing means 36, as applied to winding 14, is temporarily similar to that of FIG. 3d. The center point of the drive shown in FIG. d is positive with respect to reference potential and thus the drive signal has a positive bias which will counteract the effects of the increased magnetic field being sensed. The system will then quickly return to a balanced condition such that the square wave output from winding 16 has substantially equal positive and negative time durations.

As previously explained, the magnetic rod 12 is very sensitive to small amounts of magnetic field. Thus, a very minimal magnetic field strength will distort the apparent field strength indications being obtained from winding 16. It is thus imperative that the rod 12 be kept in a "apparent" minimum flux condition or a centralized flux condition at all times to maintain sensitivity and accuracy of indication. This is accomplished through the use of feedback signals to substantially exactly counteract the effects of the magnetic field being sensed. Since integrator 50 is providing this feedback signal for the counterbalancing, it stands to reason that this signal is indicative of the total field sensed to date (including both increases and decreases in magnetic field) and must therefore be indicative of the magnetic field strength being sensed at any given moment. Thus, the output indication of magnetic field strength being sensed appears on lead 52.

FIG. 4 is somewhat similar in operation to that of FIG. 1 except that it does not use the positive and negative voltage peak detectors since integrator 254 will accomplish the same result as the detectors 38, 40 and integrator 50 of FIG. 1 on a long term basis. Amplifier 256 is merely used to invert the output from integrator 254. The approach used in FIG. 1 provides a quicker response and in some applications is more advantageous than the relatively slower response of the circuit for FIG. 4.

The main advantage and alteration of FIG. 4 as compared to FIG. 1 is within the block 206 which is comparable to polarity logic block 20 of FIG. 1. More information will be provided on this after a quick run-through of the operation of FIG. 4. As previously indicated, the sensor 200 is driven by a triangular current waveform passing through winding 201 of the sensor. The current applied thereto induces a voltage in winding 204 of the sensor and this voltage is applied to the inverting terminal of the voltage comparator amplifier 212. The application of the voltage from winding 204 to comparator 212 is determined by the switch position of the switches 208 which in turn are controlled by the D flip-flop 220. As illustrated, the voltage on lead 210 will always be positive with respect to ground 209 due to the circuit configuration. As may be noted, switch 208 is essentially a full-wave rectifier. The feedback resistor 218 is used to provide a small amount of hysteresis to the voltage comparator. Whenever the voltage level of the signal on lead 210 becomes less than a predetermined voltage value as applied to the inverting terminal of comparator 212, the output from this comparator will go from a logic "0" to a logic "1". This change of logic level on the output of comparator 212 will clock the flip-flop 220 and will change the state of this flip-flop since the $\overline{Q}$ terminal 222 is fed back to the D input. The change of state of D flip-flop 220 will induce the switching of the voltage signals to the analog integrator 234. The level change of signal on output lead 240 from integrator 234 will be in the opposite direction after the flip-flop 220 has changed states. This output signal on lead 240 is fed to the block 248 comprising the voltage-to-current converter. The current through winding 201 is proportional to the voltage across resistor 262 as provided by the combination of the outputs from inverting amplifier 256 and the signal through resistor 246 from the output of integrator 234.

The incremental permeability circuit 206, by using a single comparator, and switching the input signal as obtained from winding 204 has a definite advantage over the circuit of FIG. 2 in that the voltage offset which may occur in the comparator 212 is effectively canceled. This can be accomplished since there is no interest in the actual permeability at a given point, but only in that the incremental permeability be the same for both polarities of a (di/dt) of the excitation current. Thus, detector 206 is probably more appropriately entitled an "incremental permeability sensing circuit" than a "saturation detector" as might also be used since the circuit can be used to sense when the magnitude of the permeability is increasing from a low value to a higher value or from a higher value to a lower value thereby indicating if the core is going into or coming out of saturation.

As drawn, FIGS. 5a–5f illustrate two conditions, the first taking place from time $t_0$ to time $t_1$ and the second situation from $t_2$ to $t_3$. In the first case from $t_0$ to $t_1$, a constant external field is acting upon the core of sensor 200. In waveform a, a triangular waveform represents the current through winding 201 or the voltage across resistor 262 which has a DC bias on it equal to and opposite the external field being sensed and as represented by the dash line curve $H_E$. Due to feedback action, the total resultant flux in the core will remain substantially symmetrical and thus will normally be a triangular waveform centered with respect to the zero line. The solid line of FIG. 5c illustrates the signals obtained from winding 204. The upper part of waveform c including the dash lines are indicative of the signal appearing at the input of comparator 212 after essentially being full-wave rectified by switches 208. The comparator 212 will provide an output on lead 213 only for a very short time during which the input on lead 210 is less than the bias generated by the voltage dividing resistors 214 and 216 before the switching of the D flip-flop 220 causes the feedback triangular wave generator to switch its direction of level change and start the sensor output toward a high voltage level again. As shown in waveform e, the flip-flop 220 changes state for each pulse appearing on the clock input thereof from comparator 212 with waveform f illustrating the output from the voltage reference switches 226 and 228 as applied to the input of integrator 234. Since the time from $t_0$ to $t_1$ is a stable condition, each of the pulse widths on waveform c are identical, thus making the distance between pulses in waveform d identical. Thus, the waveform f is completely symmetrical.

The time from $t_2$ to $t_3$ illustrates the external field decreasing the magnitude along the axis of the sensor thereby increasing the time between the second and third pulse of waveform d. Thus, the voltage applied to integrator 234 is unsymmetrical such that the feedback signal is biased a different amount due to the integrating action of the integrator 254. The total flux in sensor 200 is eventually again returned to a symmetrical condition as explained in connection with FIGS. 1 and 2.

Although I have illustrated two embodiments of the sensing circuit, any means of sensing the timing between zero points (or other symmetrical and detectable points) of the output signal from winding 16 may be used other than the polarity logic circuit 20 and and the integrator 32. In other words, counting apparatus could equally well be used in some instances to determine times. Also, although an integrator of a given form is illustrated for block 50 and positive and negative voltage peak detectors are used to provide information to this integrator, any other suitable storage means for storing the information relative to the past history of flux being sensed will also operate satisfactorily.

To practice the invention, all that is required is a means for driving a quantity of magnetic material, which is direction sensitive relative to a magnetic field being sensed, to saturation in opposite polarity directions, means for detecting the relative times to go between positive and negative saturation and vice versa in response to a driving signal and means for biasing the driving signal whereby the hysteresis loop of the magnetic material is normally centered on the drive signal.

In view of the above, I wish to be limited not by the specific embodiment illustrated but rather by the scope of the appended claims wherein I claim:

1. Magnetic field sensing apparatus comprising, in combination:

saturable core solid rod reactor means including a first winding coupled through a magnetic core to a second winding each of said windings being coaxially wound relative the mechanical axis of said solid rod means;

polarity logic circuit means, connected to said first winding and providing an integrated output which changes output signal slope when the amplitude of signals obtained from said first winding passes predetermined values;

detection means, connected to said logic circuit means, for producing a signal indicative of time non-symmetry, with respect to a reference, in the signal obtained from said reactor means;

summing means, connected to said logic circuit means, to said detection means and to said second winding for providing a biased oscillatory drive feedback signal, the bias portion of the feedback signal varying directly as a function of field strength in the vicinity of said reactor means; and output means, connected to said summing means, for outputting a field strength indicative signal.

2. The method of sensing magnetic field strength comprising the steps of:

cyclically driving a solid magnetic core to saturation in opposite directions wherein the X dimension of said core in a coordinate system is many times greater than the Y and Z dimensions;

detecting the relative times of positive to negative saturation and negative to positive saturation;

providing a first output signal indicative of the detected relative times;

integrating said first output signal to provide a triangular wave signal having a voltage bias offset indicative of sensed magnetic field strength in line with the X dimension of said core;

converting the biased triangular wave to a feedback biased, constant rate of change, cyclical driving current for driving said core to saturation wherein the bias current position thereof substantially cancels the effects of sensed magnetic fields in the X dimension; and outputting a second signal proportional to the voltage bias offset as being indicative of sensed magnetic field strength in the X dimension.

3. The method of sensing magnetic field strength in a closed loop system comprising, the steps of:

cyclically driving a solid magnetic rod, having an axis in the X direction, to saturation in opposite polarity directions;

detecting the relative times of positive and negative saturation;

generating a biased feedback drive current signal from the detected relative times of positive and negative saturation for driving the magnetic rod wherein the bias substantially cancels the effects of any magnetic field in the X direction of said magnetic rod; and outputting a magnetic field strength signal biased on the amount of bias in the drive current signal.

4. Apparatus for sensing magnetic field strength in a closed loop system comprising, in combination:
- solid cyclindrical magnetic rod apparatus having a length in the X direction which is much longer than its radius;
- first means, connected to said magnetic rod apparatus, for detecting the relative times of opposite polarity saturations;
- second means, connected to said first means, for generating a biased feedback drive current signal for cyclically driving said magnetic rod to saturation in opposite polarity directions wherein the bias substantally cancels the effects of any magnetic field in the X direction of said magnetic rod; and
- third means, connected to said second means, for outputting a magnetic field strength based on the amount of bias in the drive current signal.

5. Apparatus as claimed in claim 4 wherein said second means includes:
- rectangular wave generating means, for generating a rectangular wave signal having high and low portions corresponding in time duration to corresponding opposite polarity saturation times of said magnetic rod apparatus;
- fourth means, for integrating said rectangular wave signal to provide biased output triangular wave signal;
- fifth means, connected to said fourth means, for providing a first integrated signal indicative of the integrated value of the bias in said triangular wave signal; and
- summing means, connected to said fourth means and said fifth means, for summing said triangular wave signal and said first integrated signal to provide as a combined output a signal for cyclically driving said magnetic rod to saturation.

6. Self-excited magnetic field detection apparatus comprising, in combination:
- solid magnetic rod material means including input and output windings coaxially wound relative the mechanical axis of said solid rod means;
- detection means, connected to said output winding of said magnetic means, for providing at its output a rectangular wave output first signal having high and low portions corresponding in time duration to the relative symmetry of permeability saturation times of said magnetic material means in opposite saturation conditions; and
- feedback means, connected between the output of said detection means and said input winding of said magnetic means, for providing a biased drive signal to said magnetic means whereby the biased portion of the drive signal is indicative of and substantially counteracts the effects of a magnetic field being sensed on the symmetry of saturation times for said magnetic material means.

* * * * *